HIGH THRESHOLD DIODE TRANSISTOR LOGIC CIRCUITRY

Filed Sept. 8, 1966

INVENTOR.
Ronald L. Treadway
BY
Mueller, Aichele & Rauner
ATTY'S.

May 27, 1969 R. L. TREADWAY 3,446,994

HIGH THRESHOLD DIODE TRANSISTOR LOGIC CIRCUITRY

Filed Sept. 8, 1966 Sheet 2 of 3

INVENTOR.
Ronald L. Treadway

BY Mueller, Aichele & Rauner

ATTY'S.

INVENTOR.
Ronald L. Treadway
BY
Mueller, Aichele & Rauner
ATTY'S.

United States Patent Office 3,446,994

Patented May 27, 1969

3,446,994
HIGH THRESHOLD DIODE TRANSISTOR LOGIC CIRCUITRY

Ronald L. Treadway, Scottsdale, Ariz., assignor to Motorola, Inc., Franklin Park, Ill., a corporation of Illinois Filed Sept. 8, 1966, Ser. No. 577,870
Int. Cl. H03k *19/08*
U.S. Cl. 307—299 11 Claims

ABSTRACT OF THE DISCLOSURE

A high threshold, diode-transistor logic circuit including a multi-emitter output semiconductor device such as a multi-emitter transistor. The output device is driven by an input semiconductor device and input gate circuitry which is adapted to receive binary logic signals at a level sufficiently high to reverse breakdown one base emitter junction of the output device. A resistive bias circuit is connected between the input semiconductor device and a voltage supply terminal for biasing the input semiconductor device nonconducting in the absence of logic signals above a predetermined magnitude concurrently applied to the input gate circuitry.

In another embodiment of the invention, the multi-emitter logic circuitry is connected in a J–K flip-flop in a symmetrical circuit configuration comprising two identical cross coupled logic gates of the type described.

This invention relates generally to integrated semiconductor logic circuits and more particularly to a high threshold diode-transistor logic circuit having improved noise immunity characteristics.

In the past, when a computer logic circuit was required to meet certain noise immunity standards in cases where the computer was to be subjected to high background noise levels, it was necessary to include within the logic circuitry level shifting diodes or other circuit components which would insure that the logic circuit output would change only after the input signals reached a predetermined threshold level. In addition to requiring a relatively large number of circuit elements to provide desired threshold noise immunity characteristics, these prior art logic circuits frequently did not provide desired temperature tracking due to the particular diode-transistor connections used.

Accordingly, it is one object of this invention to provide a new and improved high threshold diode-transistor logic circuit with a minimum number of integrated circuit components.

It is another object of this invention to provide a new and improved logic circuit of the type generally described having excellent temperature tracking capabilities.

It is another object of this invention to provide a logic circuit of the type described which may be integrally connected with additional diodes and transistors to form novel J–K and R–S flip-flops, thereby imparting to these flip-flop circuits the improved noise immunity characteristics referred to above.

A feature of this invention is the provision of a logic circuit including an output semiconductor device having a collector region, a base region and at least two emitter regions displaced from each other on opposite sides of the best regions. An input doide-transistor gate circuit is coupled to one of the emitter regions to produce an avalanche voltage at one emitter-base junction of the output semiconductor device when a predetermined input signal condition is present at the gate circuit. This high avalanche or reverse breakdown threshold voltage of the output semiconductor device insures that a high threshold level of noise immunity is provided for input signals applied to the input gating circuitry.

Another feature of the invention is the provision of an output semiconductor breakdown device of the type described which is adapted to be connected as an integral portion of a clocked J–K or R–S flip-flop. These clocked flip-flops are constructed in a novel integrated circuit configuration to insure that input logic information is at a predetermined logic level before the state of the R–S or J–K flip-flop will be changed.

These and other objects and features of this invention will become more fully apparent in the following description of the accompanying drawings wherein.

Briefly described, the DTL logic gate of this invention includes a semiconductor breakdown device having a collector region, a base region, and at least two separate emitter regions in contact with the base region. One of the emitter regions is connected to an input diode-transistor circuit for receiving a reverse-breakdown or avalanche voltage necessary to drive the output device to reverse breakdown and into satuation. An output circuit is connected between a voltage supply terminal and the collector region of the ouput breakdown device and this circuit may be a simple resistive element or a diode-transistor totem pole output, depending upon the line driving capacity required.

The input circuit to the reverse-breakdown output semiconductor device includes a plurality of diodes forming one or more AND gates which are coupled through transistors or other suitable means to one or more of the emitters of the output semiconductor breakdown device. When logic signals exceeding a predetermined level are simultaneously applied to an input AND gate, the output device will break down at an emitter-base junction thereof and the output device will be driven into saturation. This switching action will cause the voltage level at the collector region of the output breakdown device to be switched from a binary ONE to a binary ZERO level.

Thus, by using a single, multiple emitter output semiconductor breakdown device operated in the reverse breakdown mode, an extremely high level of noise immunity is provided in a compact integrated circuit requiring a minimum number of components.

Other circuits which embody the features of this invention include high speed clocked R–S and J–K flip-flops which also exhibit the high level of noise immunity described above with reference to the DTL gate circuit. These flip-flops are symmetrically cross-coupled in an integrated circuit configuration to provide clocked R–S and J–K operation for various computer applications.

Figure 1:
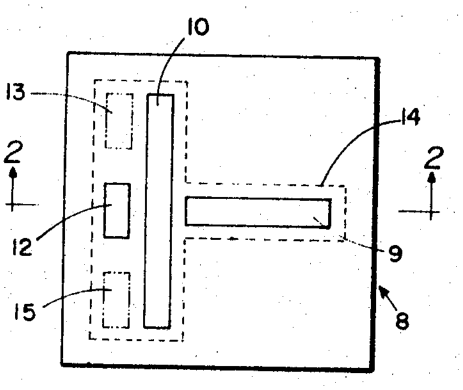
FIG. 1 is a plan view of the output semiconductor breakdown device of this invention.
Figure 2:
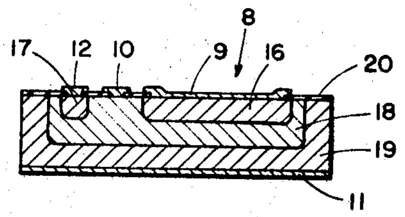
FIG. 2 is a cross-sectional view of FIG. 1 taken along lines 2—2 thereof.

Referring in somewhat more detail to the drawings, there is shown in FIGS. 1 and 2 a multiple emitter reverse breakdown semiconductor device constructed in accordance with the present invention. This device includes two emitter regions 16 and 17, a base region 18 and a collector region 19. Emitter electrodes 9 and 12 are in electrical contact with the emitter regions 16 and 17 respectively and are spaced on the opposite sides of base electrode 10. The emitter-base and base-collector junctions of the device 8 terminate at the surface thereof and a passivating silicon dioxide coating 20 is grown on the surface of the silicon wafer prior to metal overlay or deposition of the above mentioned electrodes. This process is carried out in accordance with known integrated circuit construction techniques.

Collector electrode 11 is shown in electrical contact with the lower surface of collector region 19, but this electrode connection can be and usually is made at the upper surface of the reverse breakdown device.

The device shown in FIGS. 1 and 2 may include as many emitters as desired and the dotted regions 13 and 15 illustrate where two additional emitters may be formed by known fabrication techniques in order to accommodate additional input connections that may be required for a particular logic circuit application.

The dotted line 14 in FIG. 1 represents the extremities of the underlying base region 18, but the particular geometries shown in FIGS. 1 and 2 define only one of many possible device configurations which may be used in the logic and flip-flop circuits to be described below.

Figures 3, 4:
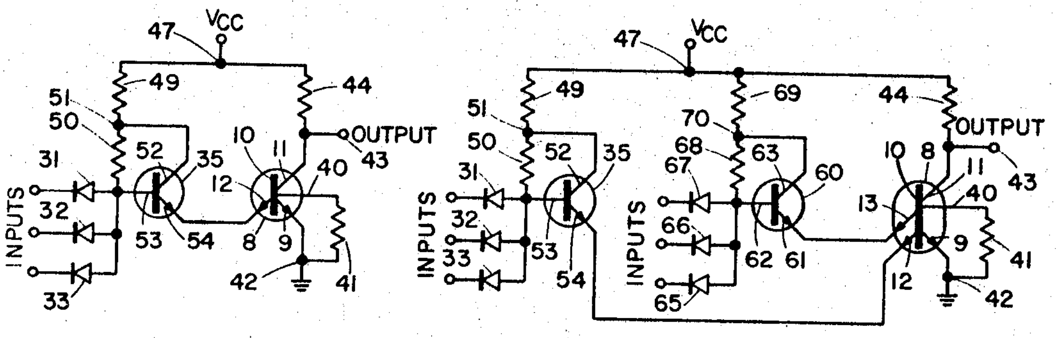
FIG. 3 is a schematic diagram of the basic diode-transistor logic (DTL) circuit according to this invention.
FIG. 4 is a modification of FIG. 3 and includes increased input logic capability relative to the logic circuit of FIG. 3.

FIG. 3 illustrates a diode-transistor logic circuit incorporating the multiple emitter semiconductor breakdown device 8. Output device 8 includes emitter electrodes 9 and 12, a base electrode 10, and a collector electrode 11 from which an output signal is derived at terminal 43. A pull-down resistor 41 is connected between the base electrode 10 and a point 42 of reference potential and provides a leakage current path for device 8 when it is not driven to saturation by a reverse breakdown voltage at emitter 12. Resistor 41 also provides the necessary turn-off current path for charge stored in the base of the device 8 when it is driven into saturation.

The diode-transistor logic circuit in FIG. 1 also includes an input diode AND gate consisting of three input diodes 31, 32 and 33 which are connected to the base 53 of a transistor 35. Transistor 35 is connected at the emitter electrode 54 thereof to the emitter electrode 12 of the output device 8. Transistor 35 is biased normally non-conducting by the connection from the collector electrode 52 to the intermediate point 51 between resistors 49 and 50. These resistors form a voltage divider network between the anodes of the three input diodes 31, 32, 33 and a point 47 of collector potential $V_{CC}$.

Since the voltage differential across diodes 31, 32 or 33 is offset by the base-emitter drop in the transistor 35, the output device 8 will break down in a reverse direction when logic signals applied concurrently to the input terminals of diodes 31, 32 and 33 all reach the reverse breakdown threshold of the emitter-base junction of the output device 8 plus the forward conduction voltage between base 10 and emitter 9. When this happens, transistor saturation current will flow through the output load resistor 44 and the output voltage at terminal 43 will swing from a level of approximately $V_{CC}$ to the $V_{CE(SAT)}$ of output breakdown device 8.

The circuit illustrated in FIG. 3 exhibits excellent temperature tracking since input diodes 31, 32 and 33 and the base-emitter junction of transistor 35 produce equal and offsetting voltage changes with temperature variations as do the emitter-base junctions between emitter 12 and base 10 and between base 10 and emitter 9. The collector potential $V_{CC}$ is typically in the order of 15 volts in order that the reverse breakdown or avalanche potential of device 8 may be easily overcome and in order to accommodate a large input logic swing.

The circuit of FIG. 4 is similar to that of FIG. 3 and includes an additional emitter electrode 13 to which is connected a second input circuit identical to the input diode-transistor circuit of FIG. 3. A second transistor 60 is connected between the input diodes 65, 66 and 67 and the second emitter electrode 13. The collector 63 of transistor 60 is connected to an intermediate tap 70 between resistors 68 and 60 which form a second voltage divider network between diodes 65, 66, 67 and a point 47 of collector potential $V_{CC}$. In the circuit of FIG. 4, logic signals applied concurrently to either diodes 31, 32, 33 or diodes 65, 66, 67 at a voltage level exceeding the reverse breakdown potential of the emitter-base junction between regions 12 and 10 of device 8 plus the base-emitter forward voltage of regions 10 and 9 will cause the voltage at the output terminal 43 to drop from approximately $V_{CC}$ to $V_{CE(SAT)}$ of the output semiconductor breakdown device 8.

Figure 5:
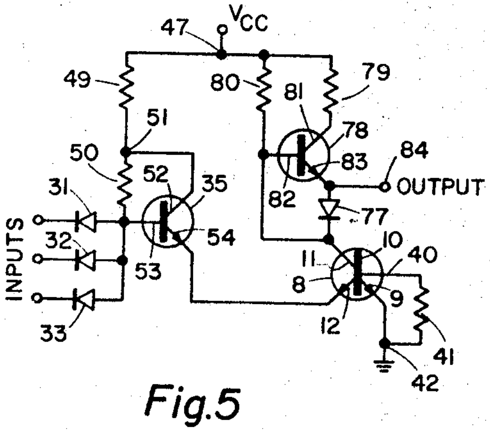
FIG. 5 is a line driver configuration with a high fan-out capability and includes a "totem pole" output conneciton in addition to the basic DTL gate in FIG. 3.

The logic circuit of FIG. 5 differs from the circuit of FIG. 3 in that a "pull-up" transistor 78 and diode 77 have been added in a so-called "totem pole" configuration between the collector 11 and resistor 79, and a base bias resistor 80 is connected between the supply voltage $V_{CC}$ and the base of transistor 78. Transistor 78 turns on as device 8 turns off and remains on until the voltage at the output terminal 84 reaches a level sufficiently high to reverse bias the base-emitter junction of transistor 78. Since transistor 78 will normally be driving a capacitive load at output terminal 84, the time that transistor 78 remains on after output device 8 turns off will depend upon the time required for this capacitive load to charge up to a voltage level sufficiently high to reverse bias the transistor 78. But until transistor 78 turns off, it provides an output current drive to a preceding stage which would have been unavailable using, for example, the circuit of FIG. 3.

Figure 6:
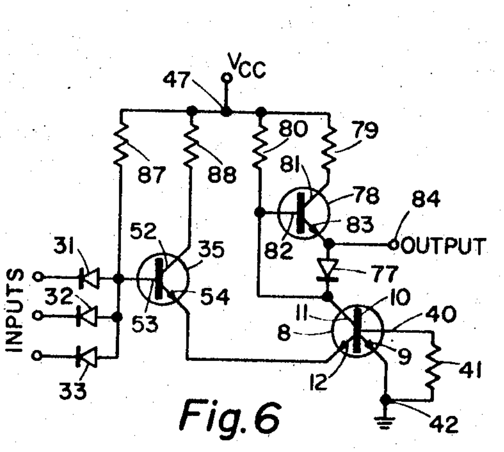
FIG. 6 is similar to FIG. 5 and includes a slightly different biasing arrangement for the input and output transistors.

The logic circuit in FIG. 6 differs from the circuit of FIG. 5 only in that the transistor 35 is connected through a separate collector load resistor 88 to the collector potential $V_{CC}$. This connection permits the collector potential of transistor 35 to remain at a constant voltage independent of the voltage variations at the intermediate tap 51 (see FIG. 5) and also enables the current gain, beta, of transistor 35 to be better controlled.

The following is a table of exemplary resistor values for the logic circuits in FIGS. 3 through 6.

Table I

| Resistor: | Value (kilohms) |
|---|---|
| **41** | 5 |
| **41*a*** | 1.8 |
| **44** | 15 |
| **49** | 3 |
| **50** | 12 |
| **68** | 12 |
| **69** | 3 |
| **79** | 1.5 |
| **79*a*** | 1.0 |
| **80** | 15 |
| **80*a*** | 10 |
| **87** | 15 |
| **88** | 1.7 |

J–K FLIP-FLOP OPERATION

Figure 7:
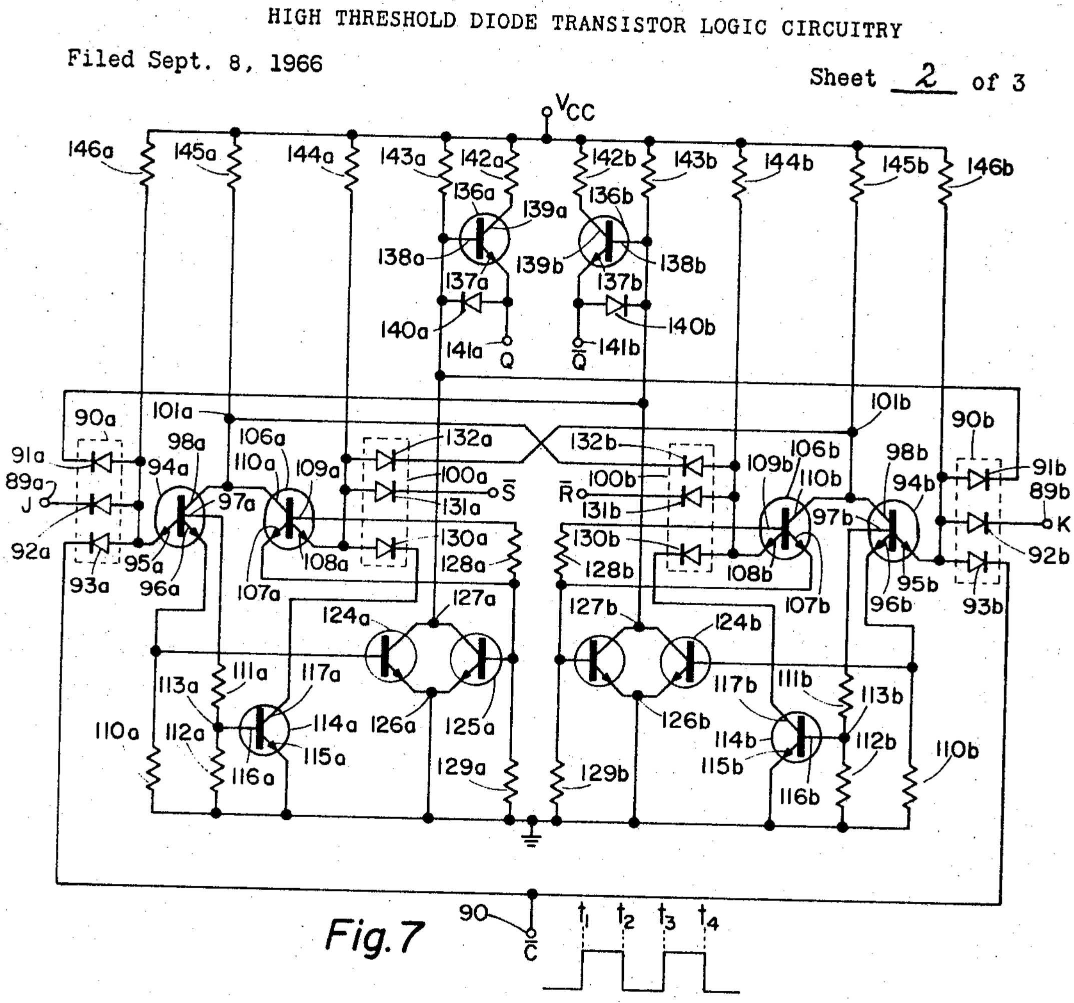
FIG. 7 is a schematic diagram of an integrated J–K flip-flop including the basic DTL gate of FIG. 3 and the noise immunity features thereof.

The symmetrically coupled J–K flip-flop in FIG. 7 is described below with reference to the switching operation of the integrated circuit transistors in both the *a* and *b* portions of the flip-flop. Among the functional components in the *a* and *b* portions of the flip-flop include respectively a first diode AND gate **90*a*, 90*b*, a first reverse-breakdown semiconductor device 94*a*, 94*b*, and a second reverse-breakdown semiconductor device 106*a*, 106*b*. Further included in each portion are a second diode AND gate 100*a*, 100*b*, a switching transistor 114*a*, 114*b*, a transistor pair 124*a*, 125*a*–124*b*, 125*b* and an output transistor 136*a*, 136*b***. The remaining explanation of the flip-flop schematic diagram in FIG. 7 will be with reference to its bistable switching operation.

Since the particular voltage level at the output terminals 141*a* and 141*b*, as well as the levels at other points in the circuit of FIG. 7 will vary in accordance with the supply voltage level, and since all points in the circuit will always be at one of two possible voltage levels between ground and $V_{CC}$ as long as the flip-flop is in one or the other of the two stable states, then the voltage variations at various points in FIG. 7 will be referred to as "high" or "low" in the following description of the clocked operation of FIG. 7.

Using positive logic, assume that the flip-flop of FIG. 7 is in its RESET state with $\overline{Q}$ at a binary ONE level and Q at a binary ZERO level. The base 138*b* of output transistor 136*b* is at $V_{CC}$, and with current flowing through resistor 143*a*, the potential at the base 138*a* of output transistor 136*a* is some IR drop below $V_{CC}$. Transistor 125*a* is biased conducting for the initial conditions given above, and the voltage level at the cathodes of diodes 130*a*, 131*a* and 132*a* are all "high"; this establishes a reverse breakdown level at emitter 108*a* of device 106*a* and drives breakdown semiconductor device 106*a* into saturation. The reverse bias condition for diodes 130*a*, 131*a* and 132*a*, which consitutes a diode AND gate 100*a*, obtains since (1) diode 130*a* is effectively disconnected from the circuit as long as switching transistor 114*a* is non-conductive, (2) $\overline{S}$ and $\overline{R}$ are "high" during straight toggling operation and may, if desired, be connected to a single DC voltage source, and (3) with transistors 94*b* and 106*b* non-conducting, the cathode of diode 132*a* is at approximately $V_{CC}$. Therefore, since the input level at diodes 130*a*, 131*a*, 132*a* is sufficiently high to break down the emitter-base junction between emitter 108*a* and base 109*a*, saturation current will flow from emitter 107*a* and through resistor 129*a* to ground.

For the static initial conditions described above and in the absence of clock signals and J and K information applied to the flip-flop, the first reverse-breakdown semiconductor device 94*a* on the *a* side of the flip-flop will be in saturation and the first reverse-breakdown semiconductor device 94*b* on the *b* side of the flip-flop will be non-conducting.

With the J–K flip-flop of FIG. 7 in the RESET state as defined above, consider now the simultaneous application of a positive going clock signal $\overline{C}$ at terminal 90 with J and K input information applied to terminals 89*a* and 89*b* at time $t_1$. Since the cathode of diode 91*b* is "low" when Q is low then an "all ONE" input condition cannot exist at the first AND gate 90*b* on the *b* side of the flip-flop. However, since the $\overline{Q}$ output at 141*b* is "high," an "all ONE" condition exists at the first AND gate 90*a* on the *a* side of the flip-flop, and this reverse biases the emitter-base junction between emitter 95*a* and base 97*a* to avalanche or breakdown, driving the first reverse-breakdown semiconductor device into saturation. With current flowing from emitter 96*a* and with voltage at intermediate tap 113 pulled up to a level above ground, the transistor 124*a* conducts and the switching transistor 114*a* is also driven into conduction. With switching transistor 114*a* conducting, diode 130*a* is forward biased and the second reverse-breakdown semiconductor device 106*a* is turned off. This, in turn, turns off transistor 125*a* and the base of transistor 125*a* goes to approximately ground potential. However, since there is a small leakage current in the base circuit of device 106*a*, the potential at the base of transistor 125*a* never goes to ground potential.

When $\overline{C}$ goes low again at time $t_2$, diode 93*a* is again forward biased and the first breakdown semiconductor device 94*a* is again turned off. As device 94*a* turns off, the voltage at the common collector output point 101*a* goes "high" to approximately $V_{CC}$ for the first time and this positive transition is coupled via conductor 102*a* to the cathode of diode 132*b* in the three diode AND gate 100*b*. Now, diode AND gate 100*b* is presented with an "all high" condition at diodes 130*b*, 131*b* and 132*b* and the emitter-base junction between emitter 108*b* and base 109*b* is broken down in the reverse direction, causing current to flow through resistor 129*b* and turn on transistor 125*b*. With transistor 125*b* conducting, the $\overline{Q}$ output at terminal 141*b* goes "low" and the state of the J–K flip-flop is changed from its RESET to its SET state.

At time $t_3$, the clock pulse $\overline{C}$ goes high again and now the three diodes 91*b*, 92*b* and 93*b* are all reverse biased, causing the emitter-base junction between emitter 95*b* and base 97*b* to break down and drive the semiconductor device 94*b* into saturation. With device 94*b* conducting, the *b* side of the flip-flop is now conditioned for a change of state on the negative going edge of the clock pulse $\overline{C}$ at time $t_4$, and the switching of the *b* side of the flip-flop is identical to that described with reference to the switching of the *a* side of the flip-flop.

The first and second multiple-emitter breakdown semiconductor devices 94*a*, 94*b* and 106*a*, 106*b* on each side of the flip-flop respectively, are identical to the multiple-emitter breakdown semiconductor devices shown in FIGS. 1 and 2 and included in the logic circuits illustrated in the schematic diagrams in FIGS. 3 and 6. The emitter-base reverse breakdown or avalanche voltages for these devices is in the order of seven (7) volts—a feature that imparts to the flip-flop, as well as the logic circuits, a high level of noise immunity.

For purposes of describing the toggling operation of the J–K flip-flop in FIG. 7, the $\overline{S}$ and $\overline{R}$ inputs to diodes 131*a* and 131*b* were assumed connected to a constant DC voltage source sufficiently high to reverse bias diodes 131*a* and 131*b*, respectively. However, depending upon the particular application in which the J–K flip-flop is used, $\overline{S}$ and $\overline{R}$ signals may be applied at periodic or non-periodic time intervals to the diodes 131*a* and 131*b* to set and reset the J–K flip-flop, independently of the J and K input information.

Both *a* and *b* portions of the J–K flip-flop in FIG. 7 have identical output portions which include respectively output transistors 136*a* and 136*b*, with diodes 140*a* and 140*b* connected between the emitter and base regions of the output transistors 136*a* and 136*b*. This diode connection is similar to that of diode 77 in the line driver logic circuits of FIGS. 5 and 6, and diodes 140*a* and 140*b* provide a discharge path for the input capacitance to a succeeding stage (not shown) after output transistors 136*a* and 136*b* turn off. This decreases the response time of the flip-flop and greatly enhances the overall operational speed when a number of J–K flip-flops are connected in a cascade arrangement.

The following table of values for the circuit components in FIG. 7 is given as exemplary of one J–K flip-flop successfully limited and tested according to the teachings of this invention, but these values should not be construed as limiting the scope of the invention.

Table II

| Resistor: | Value (kilohms) |
|---|---|
| **110***a*, *b* | 5 |
| **111***a*, *b* | 1 |
| **112***a*, *b* | 10 |
| **128***a*, *b* | 10 |
| **129***a*, *b* | 5 |
| **142***a*, *b* | 1.5 |
| **143***a*, *b* | 15 |
| **144***a*, *b* | 15 |
| **145***a*, *b* | 6 |
| **146***a*, *b* | 15 |

R–S FLIP-FLOP OPERATION

Figure 8:
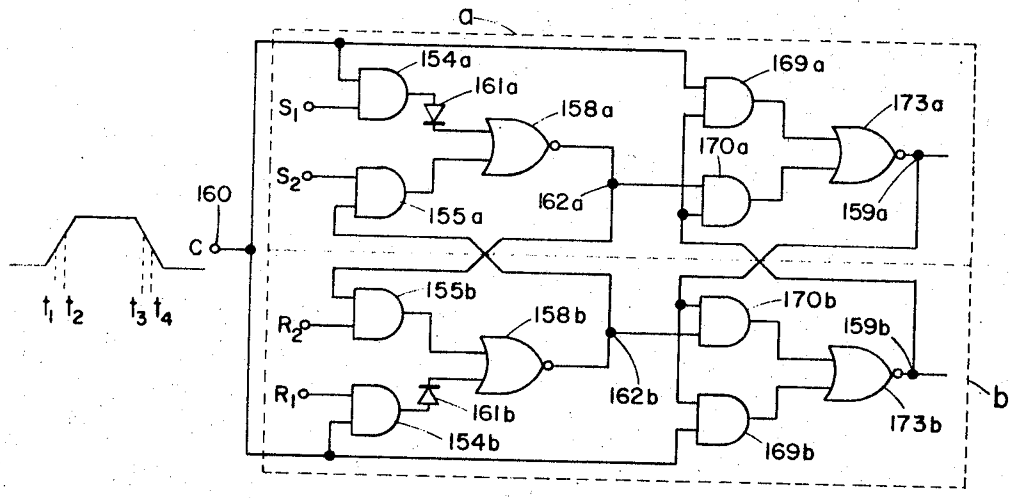
FIGS. 8 and 9 are block and schematic diagrams respectively of a novel clocked R–S flip-flop incorporating all of the novel features of the basic DTL gate in FIG. 3.
Figure 9:
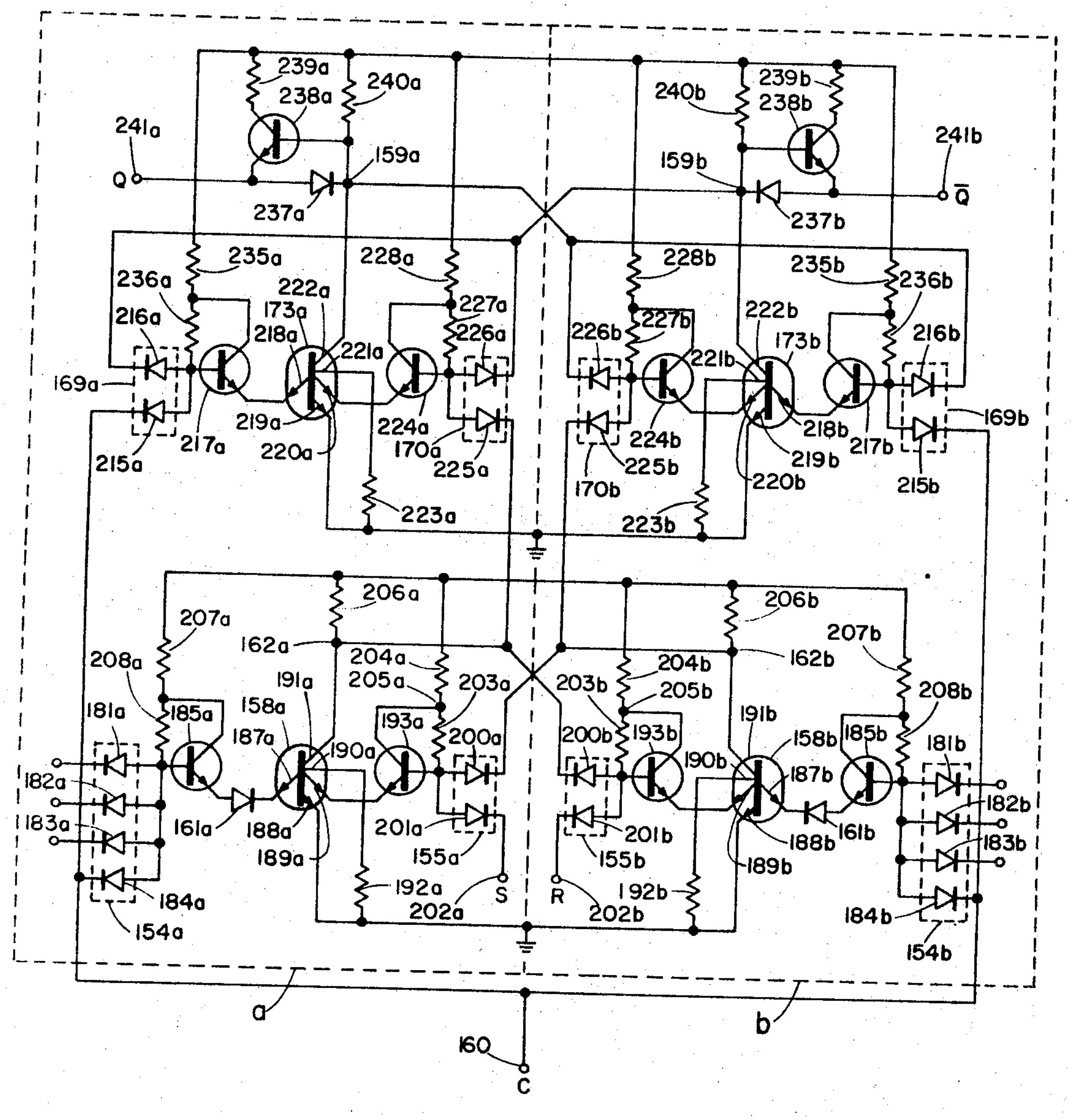

The block diagram in FIG. 8 and the schematic diagram in FIG. 9 illustrate the R–S flip-flop constructed according to the teachings of this invention, and this flip-flop will be described in detail with reference to the bistable switching action thereof. Initially, the various gates in the functional block diagram in FIG. 8 will be identified, and since the $a$ and $b$ portions of the flip-flop contain identical corresponding components in circuit portions which are images of one another, the corresponding components or functional blocks in the $a$ and $b$ portions of the flip-flop will be characterized using identical descriptions. Where a particular cross-coupled connection is described and a component in the $a$ or $b$ portion is connected to a component in the opposite portion, this will be referred to as a connection to the complementary portion of the flip-flop.

Both $a$ and $b$ portions of the flip-flop include first and second AND gates 154$a$, $b$ and 155$a$, $b$ connected to the input of a first NOR gate 158$a$, $b$ with a level shifting diode 161$a$, $b$ connected between the first AND gate and the NOR gate as shown. These components are symmetrically cross-coupled to form the master-portion of the flip-flop.

In the slave-portion of the flip-flop are included a third and fourth AND gates 169$a$, $b$ and 170$a$, $b$ the outputs of which are connected to a second NOR gate 173$a$, $b$. The outputs of the second NOR gates 173$a$, $b$ are cross-coupled to the inputs of the third and fourth AND gates 169$a$, $b$ and 170$a$, $b$ in the complementary portion of the flip-flop. The exact nature of the functional cooperation of the gates in FIG. 8 will become more readily understood in the following description of the bistable switching operation of the schematic diagram in FIG. 9.

Referring to FIG. 9, consider the condition prior to time $t_1$ (FIG. 8) where the flip-flop is in its RESET state with $\bar{Q}$ at a logical ONE level and Q at a logical ZERO level. The lower or master-portion of the flip-flop will be in a state where first NOR gate 158$a$ is non-conducting and first NOR gate 159$b$ is conducting. In this initially assumed condition, point 162$a$ will be "high" and point 162$b$ will be "low." With both diodes 225$a$ and 226$a$ in the fourth AND gate 170$a$ reverse biased, transistor 224$a$ is conducting, the emitter-base junction between emitter 220$a$ and base 221$a$ is broken down and semiconductor device 173$a$ is in saturation.

On the leading edge of the clock pulse at time $t_1$ (see FIG. 8) diode 215$a$ in the third AND gate 169$a$ becomes reverse biased. Since diode 216$a$ is already reverse biased with point 159$b$ "high," transistor 217$a$ is turned on and the emitter-base junction between emitter 218$a$ and base 221$a$ of the breakdown semiconductor device 173$a$ breaks down. This latches out the master-portion of the flip-flop at time $t_1$. The level shifting diodes 161$a$, $b$ which are connected between the transistors 185$a$, $b$ and breakdown devices 158$a$, $b$ enable the slave-portion of the flip-flop to be latched out before the master-portion of the flip-flop is conditioned for bistable set-reset switching operation.

At time $t_2$ the leading edge of the clock pulse reaches a level sufficient to overcome the additional offset voltage of diodes 161$a$, $b$ and now the master-portion of the flip-flop is readied for bistable switching operation.

The R–S flip-flop illustrated in FIG. 9 includes several features which are similar to those described with reference to FIG. 7. Between times $t_2$ and $t_3$ the clock pulse is at a level sufficiently high to reverse bias diodes 184$a$, $b$ in the first AND gate 154$a$, $b$ on each side of the flip-flop, and binary information applied to diodes 181$a$, $b$, 182$a$, $b$, 183$a$, $b$ will be effective to control the conductive state of the slave-portion of the flip-flop. However, the number of diodes in the first AND gate 154$a$, $b$ is not critical and does not affect the scope of this invention.

Additional SET and RESET input terminals 202$a$, $b$ are connected respectively to diodes 201$a$, $b$ in the second diode AND gates 155$a$, $b$. These S and R terminals may be connected to a constant DC voltage source sufficiently high to reverse bias the diodes 201$a$, $b$ or they may be connected to SET and RESET information which is applied to diodes 201$a$, $b$ independently of the binary information coupled to the first AND gates 154$a$, $b$. However, for the purpose of describing the bistable switching of the flip-flop in FIG. 9, it will be assumed that S and R points 202$a$, $b$ are connected to a single constant DC voltage.

At time $t_3$ the trailing edge of the clock pulse reaches a level insufficient to reverse bias diodes 184$a$, $b$ and overcome the offset voltage of diodes 161$a$, $b$ and the master-portion of the flip-flop becomes fixed in the state to which it had been switched immediately prior to time $t_3$. As the trailing edge of the clock pulse continues to drop, a level is reached at time $t_4$ which is insufficient to maintain a reverse bias on diode 215$a$ in the third AND gate 169$a$, and the slave-portion of the R–S flip-flop is unlatched. Now, immediately after time $t_4$ the binary information which had been applied to the master-portion of the flip-flop during the time interval between $t_2$ and $t_3$ is shifted into the slave-portion of the flip-flop to control the conductive state thereof. If the NOR gate (breakdown semiconductor device) 158$b$ is conducting at time $t_4$, leaving the collector 191$a$ and output point 162$a$ "high," then the second NOR gate (breakdown semiconductor device) 173$a$ will remain conducting and the state of the master-slave flip-flop will remain unchanged. If, on the other hand, device 158$a$ is conducting immediately after time $t_4$ and point 162$a$ is now low, then diode 225$a$ in the fourth AND gate 170$a$ will no longer be reverse biased and device 173$a$ will begin to turn off. As this happens, the voltage at point 159$a$ rises, and eventually a level is reached where diode 226$b$ in the fourth AND gate 170$b$ is reverse biased. Diode 225$b$ was already reverse biased since point 162$b$ is now "high," and transistor 224$b$ is driven conducting. This breaks down the emitter-base junction between emitter 200$b$ and base 221$b$ of device 173$b$ and device 173$b$ is now in saturation. Thus, the voltage point 159$b$ has been pulled down to a "low" level and the voltage at point 159$a$ is now at a logical ONE level.

The output transistors 238$a$ and 238$b$ and their associated diodes 237$a$ and 237$b$ are connected in a manner identical to output transistors 136$a$ and 136$b$ in FIG. 7, and these transistors will not be described further.

In the R–S flip-flop circuit shown in FIG. 9, it will be observed that the transistors 185$a$, $b$, and 193$a$, $b$ are connected in a biasing scheme identical to the biasing arrangement used in the logic circuits of FIGS. 3 to 6. Similarly, transistors 217$a$, $b$ and transistors 224$a$, $b$ are connected in an identical biasing configuration identical to those of transistors 185$a$, $b$ and transistors 193$a$, $b$. These transistors apply the turn-on drive to the NOR gate-devices 158$a$, $b$ and 173$a$, $b$ when the inputs to the first, second, third and fourth AND gates are all "high."

From the foregoing description, it will be apparent that the logic and flip-flop circuits of this invention are capable of operating under extreme noise conditions without being triggered by high extraneous noise levels. This is accomplished by using the reverse emitter-base breakdown principle described above, and these circuits require large input logic swings to change the state of the flip-flops or to produce an output signal at the various logic gates.

The following table of values is given only by way of illustration, and these values represent the actual resistor values used in the actual operation of the flip-flop circuit shown in FIG. 9. However, the resistor values given in Tables I and II should not be construed in any way as limiting the scope of this invention.

Table III

| Resistor: | Value (kilohms) |
|---|---|
| **192**$a$, $b$ | 5 |
| **203**$a$, $b$ | 9 |
| **204**$a$, $b$ | 6 |
| **207**$a$, $b$ | 6 |
| **208**$a$, $b$ | 9 |
| **223**$a$, $b$ | 5 |
| **227**$a$, $b$ | 12 |

| | |
|---|---|
| 228a, b | 3 |
| 235a, b | 3 |
| 236a, b | 12 |
| 239a, b | 1.5 |
| 240a, b | 15 |

I claim:

1. A high threshold, diode-transistor logic circuit, including in combination:

(a) an output semiconductor device having a first conductivity type collector region, a second conductivity type base region in contact with said collector region, and at least two emitter regions of said first conductivity type which are displaced from each other in contact with said base region, (b) input circuit means connected to one of said emitter regions for applying binary logic signals thereto at a level sufficiently high to reverse breakdown one base-emitter junction of said output semiconductor device and cause current to flow in the forward direction across the other emitter base junction of said output semiconductor device, (c) said input circuit means includes an input semiconductor device having emitter, base and collector regions with the emitter region of said input semiconductor device connected to said one emitter region of said output semiconductor device and providing a signal path to said output semiconductor device when said input semiconductor device is driven into conduction, (d) circuit means coupling the other of said two emitter regions of said output semiconductor device to a point of reference potential, (e) resistance means connecting said base region of said output semiconductor device to said point of reference potential, (f) gate means connected to said input semiconductor device for receiving binary logic signals and biasing said input semiconductor device into conduction upon receipt of concurrent logic signals at a predetermined level, (g) biasing circuit means connected between said input semiconductor device and said voltage supply terminal for biasing said input semiconductor device nonconducting in the absence of said concurrent logic signals, and (h) output circuit means including output load resistance means connected between the collector region of said outpuut semiconductor device and a voltage supply terminal.

2. The logic circuit according to claim 1 wherein said biasing circuit means includes first resistor connected between said gate means and said voltage supply terminal and a second resistor connected between said collector region of said input semiconductor device and said voltage supply terminal.

3. The logic circuit according to claim 1 wherein said biasing circuit means includes a first resistor connected between said gate means and said collector region of said input semiconductor device and a second resistor connected between said collector region of said input semiconductor device and said voltage supply terminal.

4. The logic circuit according to claim 1 wherein:

(a) said output semiconductor device further includes a third emitter region separated from the other two emitter regions, and (b) said input circuit means further includes a second input semiconductor device having collector, base and emitter regions with the emitter region of said second input semiconductor device connected to said third emitter region of said output semiconductor device for providing a second signal path to said output semiconductor device for avalanching the emitter-base junction between said third emitter region and said base region of said output semiconductor device, said input circuit means further includes, (c) second gate means connected to said second input semiconductor device for receiving binary logic signals and biasing said second input semiconductor device into conduction upon receipt of concurrent logic signals at said predetermined level, and said input circuit means further includes, (d) a second biasing circuit means connected between said second gate means and said voltage supply terminal for biasing said second input semiconductor device non-conducting in the absence of concurrent logic signals applied to said second gate means at said predetermined level.

5. The logic circuit according to claim 1 wherein:

(a) said output circuit means includes a pull-up transistor connected between said voltage supply terminal and said output semiconductor device, said pull-up transistor having emitter, base and collector regions, said load resistor connected between said collector region of said pull-up transistor and said voltage supply terminal, (b) a base bias resistor connected between said base region of said pull-up transistor and said voltage supply terminal, (c) diode means connected between said emitter region of said pull-up transistor and said collector region of said output semiconductor device, (d) conductive means connecting said collector region of said output semiconductor device and said base region of said pull-up transistor, and (e) means for deriving an output signal from said emitter region of said pull-up transistor whereby said output transistor provides line driving capacity for successive gates in cascade therewith.

6. In a J–K flip-flop connected as a monolithic integrated circuit in a symmetrical circuit configuration comprising two identical cross-coupled circuit portions, each circuit portion including:

(a) a first AND gate connected to receive binary logic signals, (b) a first reverse breakdown semiconductor device connected to said first AND gate for receiving a reverse breakdown voltage, said first breakdown semiconductor device connected between a point of reference potential and a voltage supply terminal, (c) a second breakdown semiconductor device connected to said first breakdown semiconductor device at a common point and connected between said voltage supply terminal and said point of reference potential, said second breakdown semiconductor device conducting when said flip-flop is in one of its two stable states and non-connecting when said flip-flop is in the other of its two stable states, (d) a second AND gate connected to said second breakdown semiconductor device, (e) an output terminal for deriving binary output information, (f) a pair of transistors having emitter, base and collector regions and connected with their emitter-collector regions in parallel between said output terminal and said point of reference potential, one of said pair of transistors connected to said second breakdown semiconductor device is conducting, the other of said pair of transistors connected to said first breakdown semiconductor device and conducting when said first breakdown semiconductor device is conducting, (g) a switching transistor connected between said second AND gate and said point of reference potential and further connected to said first breakdown semiconductor device for receiving turn-on drive when said first breakdown semiconductor device breaks down, thereby turning off said second breakdown semiconductor device, said first breakdown semiconductor device and said other transistor in said transistor pair becoming non-conductive upon the termination of a reverse breakdown voltage applied to said first breakdown semiconductor device, thereby causing voltage at said common point of said first and second breakdown semiconductor devices to rise and initiate a change of state in said flip-flop, and (h) means cross-coupling the respective common output points of one flip-flop portion with the second AND gate in the other flip-flop portion in order to enable toggling action in said flip-flop.

7. The circuit according to claim 6 wherein:

(a) said first AND gate in each of said flip-flop portions includes a first diode connected to a source of clock signals, a second diode connected to a source of J or K information, and a third diode cross-coupled to a second common output point at said transistor pair in the complementing portion of said flip-flop, and (b) said second AND gate in each flip-flop portion including a first diode connected between said switching transistor and said second breakdown semiconductor device, a second diode connected to a source of SET or RESET signals, and a third diode connected to the common output point of said first and second breakdown semiconductor devices in the complementing portion of said flip-flop.

8. The circuit according to claim 7 wherein:

(a) said first and second breakdown semiconductor devices each include a first conductivity collector region connected to said common point, a second conductivity base region in contact with said collector region and at least two emitter regions of said first conductivity type displaced from each other and in contact with said base region, (b) one of said emitter regions of said first breakdown semiconductor device connected to said first AND gate for receiving an input breakdown voltage, the other of said two emitters of said first breakdown semiconductor device connected to the other of said pair of transistors, (c) circuit means connecting the base region of said first breakdown semiconductor device to said switching transistor for turning on said switching transistor when said first breakdown semiconductor device is conducting, and (d) a second circuit means connecting the base region of said second breakdown semiconductor device to said one of said pair of transistors for turning said one transistor off when said second breakdown semiconductor device is turned off.

9. In a master-slave clocked flip-flop constructed in a monolithic integrated circuit and in a symmetrical circuit configuration having first and second cross-coupled complementary circuit portions, each circuit portion including:

(a) a first AND gate connected to receive binary signals and connected to a source of clock pulses, (b) a first NOR gate comprising a semiconductor device having a first conductivity collector region, a second conductivity base region in contact with said collector region and a plurality of spatially separated emitter regions, all in contact with said base region and of said first conductivity semiconductor material, (c) a level shifting diode connected between the output of said first AND gate and one of said emitter regions and said first NOR gate, (d) a second AND gate connected to receive binary logic signals and having the output thereof connected to another of said plurality of emitter regions of said first NOR gate, said second AND gate having one input thereof connected to the output of said first NOR gate in the complementing circuit portion of the flip-flop, (e) a third AND gate connected to said source of clock pulses, (f) a second NOR gate having a first conductivity collector region, a second conductivity base region in contact therewith and a plurality of spatially separated emitter regions of said first conductivity semiconductor material, each in contact with said base region, (g) a fourth AND gate connected to the output of said first NOR gate and having the output thereof connected to one of said emitter regions of said second NOR gate, the output of said second NOR gate connected to the one input of each of the third and fourth AND gates in the complementary portions of the flip-flop, whereby clock pulses applied to said third AND gate latch out the master-portion of said flip-flop including said third and fourth AND gates and said second NOR gate prior to enabling a change of state in the slave-portion of said flip-flop including said first and second AND gates and said first NOR gate.

10. The circuit according to claim 9 wherein said first, second, third and fourth AND gates comprise parallel-connected diodes with said source of clock pulses connected to one diode in said first and third AND gates.

11. The flip-flop according to claim 10 wherein said first and third AND gates are connected to clock and binary signals of a magnitude sufficiently high to reverse breakdown an emitter-base junction of said first and second NOR gates, said diode insuring that said second NOR gate will conduct prior to the conduction of said first NOR gate.

References Citcd

UNITED STATES PATENTS 3,345,518 10/1967 Thompson -------- 307—299 X

ARTHUR GAUSS, *Primary Examiner.*

J. D. FREW, *Assistant Examiner.*

U.S. Cl. X.R.

307—291, 292, 302